(12) United States Patent
Winterhalter et al.

(10) Patent No.: US 8,433,528 B2
(45) Date of Patent: Apr. 30, 2013

(54) GROUND FAULT DETECTION SYSTEM AND METHOD

(75) Inventors: Craig R. Winterhalter, Cedarburg, WI (US); Lixiang Wei, Whitefish Bay, WI (US); Zoran V. Vrankovic, Greenfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 547 days.

(21) Appl. No.: 12/642,213

(22) Filed: Dec. 18, 2009

(65) Prior Publication Data

US 2011/0153234 A1 Jun. 23, 2011

(51) Int. Cl.
*G01R 31/00* (2006.01)
(52) U.S. Cl.
USPC ............... 702/58; 702/53; 324/509; 363/123; 361/76; 361/77; 361/85
(58) Field of Classification Search ............ 702/53, 702/58; 324/509; 363/37, 34, 44, 40, 56.03; 361/31, 42, 699, 76, 77, 85
See application file for complete search history.

(56) References Cited

U.S. PATENT DOCUMENTS

| | | | | |
|---|---|---|---|---|
| 4,347,542 A | * | 8/1982 | Calhoun | 361/76 |
| 5,747,955 A | * | 5/1998 | Rotunda et al. | 318/434 |
| 7,957,166 B2 | * | 6/2011 | Schnetzka et al. | 363/56.03 |
| 2008/0080106 A1 | * | 4/2008 | Mirafzal et al. | 361/42 |
| 2009/0080127 A1 | | 3/2009 | Mirafzal | |
| 2009/0085573 A1 | | 4/2009 | Blakely | |
| 2009/0109713 A1 | * | 4/2009 | Schnetzka et al. | 363/34 |
| 2009/0201706 A1 | * | 8/2009 | Zacharias et al. | 363/123 |
| 2010/0229580 A1 | * | 9/2010 | Schnetzka | 62/228.4 |
| 2011/0141774 A1 | * | 6/2011 | Kane et al. | 363/37 |

* cited by examiner

*Primary Examiner* — Carol Tsai
(74) *Attorney, Agent, or Firm* — Fletcher Yoder, P.C.; R. Scott Speroff; John M. Miller

(57) ABSTRACT

A ground fault detection system is provided. The ground fault detection system includes a magnetic core having first and second primary legs and a secondary leg disposed between the first and second primary legs. The ground fault detection system also includes first and second primary windings disposed around the first and second primary legs respectively and configured to introduce current in the first and second primary legs. Further, the ground fault detection system includes first and second secondary windings disposed around the first and second primary legs respectively and configured to detect a ground fault based upon a magnetic flux generated in response to the introduced current.

20 Claims, 3 Drawing Sheets

GROUND FAULT DETECTION SYSTEM AND METHOD

BACKGROUND

The invention relates generally to a ground fault detection system and methods for ground fault detection.

A wide range of equipment, such as electric motor drives, are known and are in use for a variety of applications, such as in factory automation systems, power generation systems and so forth. Typically a load is connected to a power source, such as a drive in the case of a motor, which provides electrical power to the load in a controlled manner. In alternating current (AC) motor drive systems, for example, electrical power is converted from an AC power source into direct current (DC) voltage. The DC voltage is then converted via an inverter into AC voltage with controlled frequency and amplitude which may be applied to drive the electric motor. Other loads are provided with power in similar ways, with converters of various types providing controlled frequency AC power, either at a fixed frequency or a controlled variable frequency (e.g., for regulating the rotational speed of a motor).

It is often desirable to detect ground faults in such systems to prevent damage of the components as well as time-consuming equipment unavailability in the case of failure due to short circuiting, and other failure causes detectable from ground fault information. One way of detecting ground faults is by using a DC link choke with a pair of inductors and one or more windings for ground fault detection. Typically, the inductors on the primary current paths filter the primary DC currents. Further, ground fault is detected by comparing currents from each path. A ground fault may have occurred if substantially high current leaks into ground instead of the load.

However, existing ground fault detection circuits may have undesirable effects. For example, some systems rely on a large number of inductors and windings that may increase the size and associated material, shipping and storage costs. Moreover, depending upon the circuit and physical winding design, unwanted spikes in current may occur that, in some cases, may be fed back to upstream circuitry (such as rectifier and other components) to its detriment.

Accordingly, it would be desirable to develop a ground fault detection system that detects ground faults while preventing excessive voltage stress in such systems.

BRIEF DESCRIPTION

Briefly, according to one embodiment of the present invention, a ground fault detection system is provided. The ground fault detection system includes a magnetic core having first and second primary legs and a secondary leg disposed between the first and second primary legs. The ground fault detection system also includes first and second primary windings disposed around the first and second primary legs respectively and configured to introduce current in the first and second primary legs. Further, the ground fault detection system includes first and second secondary windings disposed around the first and second primary legs respectively and configured to detect a ground fault based upon a magnetic flux generated in response to the introduced current.

In accordance with another aspect, a method of detecting a ground fault is provided. The method includes introducing common mode currents into first and second primary windings disposed on outer legs of an inductor and inducing magnetic flux in each of the first and second secondary windings disposed on the outer legs of the inductor. The method also includes measuring voltage across each of the first and secondary windings and detecting the ground fault based upon the measured voltage.

In accordance with another aspect, a ground fault detection system is provided. The ground fault detection system includes a magnetic core having first and second primary legs and a secondary leg disposed between the first and second primary legs. The ground fault detection system includes first and second primary windings disposed around each of the first and second primary legs respectively and first and second secondary windings disposed around the first and second primary legs respectively, wherein a common mode current through the first and second primary windings is configured to generate magnetic flux in each of the first and second secondary windings. The ground fault detection system also includes a voltage sensor configured to measure voltage across each of the first and second secondary windings and to detect a ground fault based upon the measured voltage.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide a ground fault detection system for detecting ground faults in motor drive and other electrical systems. In particular, the present technique provides an integrated DC link inductor that detects the ground fault without generating excessive voltage in the system during ground fault detection and surge operations.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
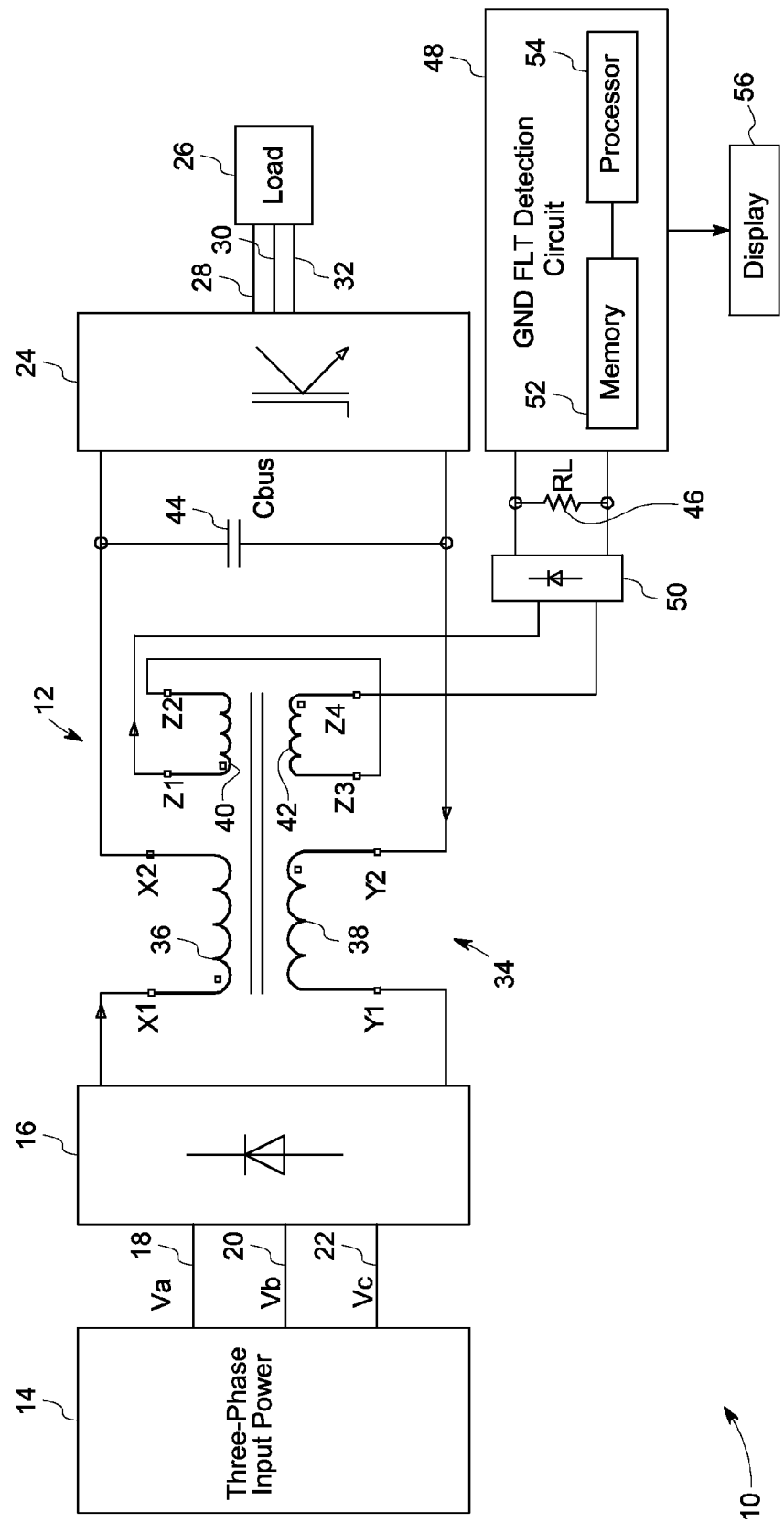
FIG. 1 illustrates a motor drive system with a ground fault detection system in accordance with aspects of the present invention.

Turning now to drawings and referring first to FIG. 1, a circuit is illustrated for providing controlled AC power to a load. In the illustrated embodiment, a motor drive system 10 is illustrated with a ground fault detection system 12, although it should be understood that various types of systems and loads may utilize the ground fault detection techniques described. In the illustrated embodiment, the motor drive system 10 includes an AC drive system that includes a power source 14 and a rectifier 16. In the illustrated embodiment, the power source 14 includes a three phase power source that is coupled to the rectifier via three phase paths generally represented by reference numerals 18, 20 and 22. However, other configurations of the input power source 14 with different numbers of phases and waveforms may be envisaged.

The rectifier 16 is configured to convert incoming AC voltage from the power source 14 to DC voltage on a DC bus. In this exemplary embodiment, the rectifier 16 includes a three phase full wave rectifier. In certain other embodiments, the rectifier 16 may include a half wave rectifier. The motor drive system 10 further includes an inverter 24 configured to convert DC voltage from the bus to an output AC voltage applied to an electrical load 26. The inverter 24 may include various solid state switching devices, such as integrated gate bipolar junction transistors, solid state relays, transistors, solenoids and other electromechanical inverter switches, and the like.

The inverter 24 may be configured to output single phase AC power, two phase AC power, three phase power, among other types of AC power. In the illustrated embodiment, the inverter 24 is coupled to the load 26 via three phase paths generally represented by reference numerals 28, 30 and 32. The load 26 may include a motor such as an induction motor that may be coupled to another machine such as a drive shaft, or a fan, for example. The load 26 may include a variety of other electrical and/or electro-mechanical devices.

The ground fault detection system 12 includes an integrated DC link inductor 34 with first and second primary windings 36 and 38 to introduce current in the inductor 34. In this exemplary embodiment, the first and second primary windings include DC link windings configured to couple the rectifier 16 and the inverter 24 of the system 10. The first and second primary windings 36 and 38 are configured to couple DC positive and negative terminals of the rectifier 16 to corresponding terminals of the inverter 24. Further, the inductor 34 includes first and second secondary windings 40 and 42 configured to detect common mode currents based upon a magnetic flux generated in response to the introduced primary current. In addition, the system 12 may include a capacitor 44 to form a low pass filter to reduce any ripples in the voltage.

The system 12 further includes a resistive load 46 and a ground fault detection circuit 48 configured to detect the ground fault based upon a measured voltage across the resistive load 46. In certain embodiments, the system 12 includes a rectifier 50 to smooth output voltages. The rectifier 50 may include a single phase, a half wave, or a full wave rectifier. In certain other embodiments, processing of signals from the first and second secondary windings 40 and 42 may be performed via the ground fault detection circuit 48.

The ground fault detection circuit 48 includes a memory 52 configured to store measured voltages across the resistive load. The memory 52 may include hard disk drives, optical drives, tape drives, random access memory (RAM), read-only memory (ROM), programmable read-only memory (PROM), redundant arrays of independent disks (RAID), flash memory, magneto-optical memory, holographic memory, bubble memory, magnetic drum, memory stick, Mylar® tape, smartdisk, thin film memory, zip drive, and so forth.

Further, the ground fault detection circuit 48 includes a processor 54 to process the measured voltages and to detect the ground fault based upon the measured voltages. In addition, the ground fault detection circuit 48 includes a display 56 to display warning/error messages indicative of detected ground faults. In certain embodiments, the ground fault detection circuit 48 may be coupled to a controller (not shown) configured to interrupt delivery of power to the load 26 in response to the ground fault.

It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output. It should also be noted that the phrase "configured to" as used herein means that the processor is equipped with a combination of hardware and software for performing the tasks of the invention, as will be understood by those skilled in the art The first and second primary windings 36 and 38 are configured to receive differential and common mode currents from the power source 14 and are configured to induce magnetic flux in the first and secondary windings 40 and 42 to facilitate detection of the common mode current, as will be described below with reference to FIGS. 2 and 3.

Figure 2:
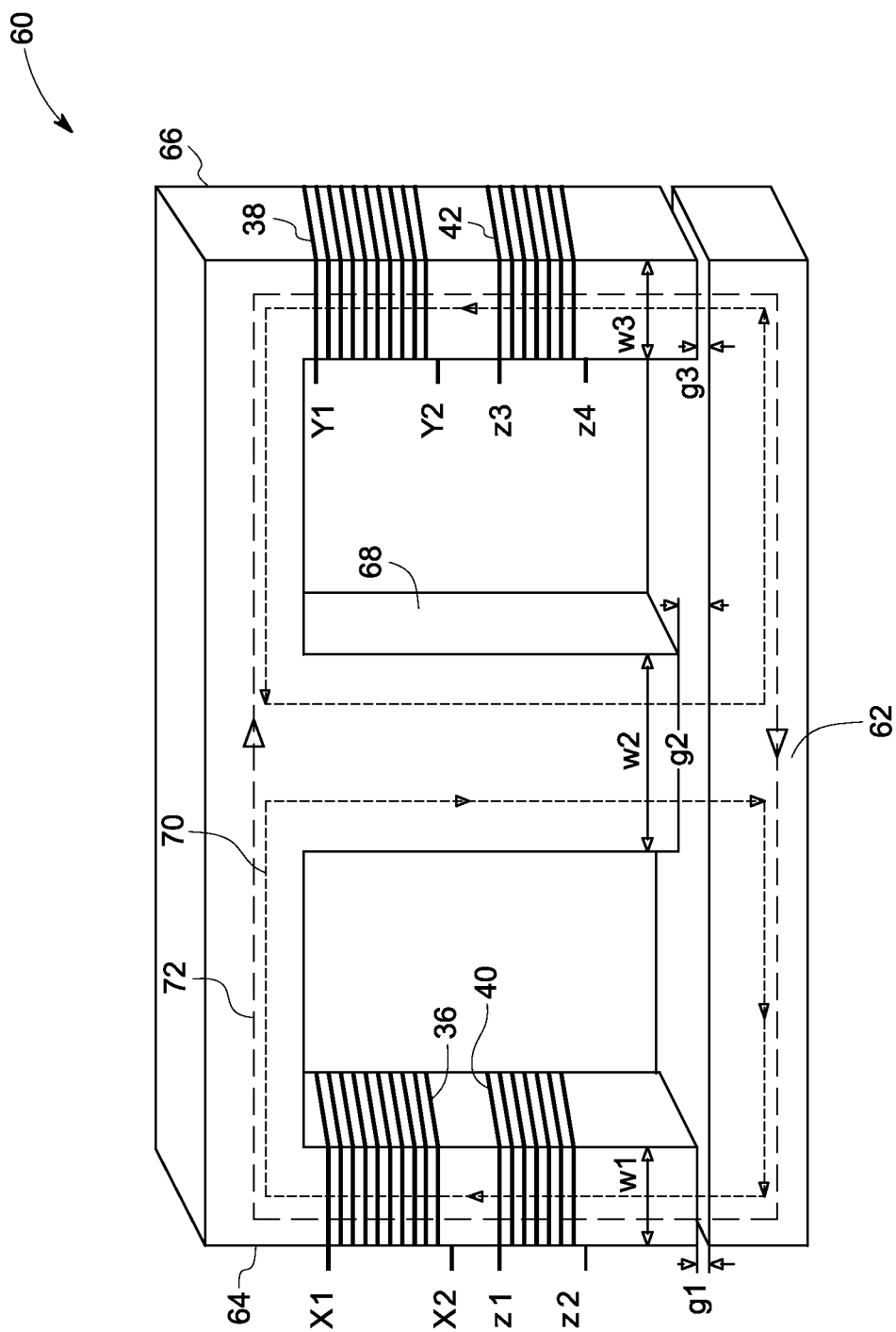
FIG. 2 is an exemplary configuration of the inductor of FIG. 1 in accordance with aspects of the present invention.

FIG. 2 is an exemplary configuration 60 of the inductor 34 of FIG. 1. In a presently contemplated configuration, the inductor 60 includes a magnetic core 62 having first and second primary legs 64 and 66. Further, it includes a secondary leg 68 disposed between the first and second primary legs 64 and 66. As illustrated, the first and second primary windings 36 and 38 are disposed around the first and second primary legs 64 and 66 respectively. The first and second primary windings 36 and 38 are configured to introduce current in the first and second primary legs 64 and 66.

The first and second secondary windings 40 and 42 are also disposed around the first and second primary legs 64 and 66 respectively and are configured to detect a ground fault based upon a magnetic flux generated in response to the introduced current. In one example embodiment, the first and second primary windings 36 and 38 are configured to receive a differential mode current (represented generally by reference numeral 70) from the power source 14 (see FIG. 1) and to induce magnetic flux intensities having opposite directions in the first and second secondary windings 40 and 42 respectively. In particular, the first and second secondary windings 40 and 42 are coupled in such as way that the differential mode currents through the first and second primary windings 36 and 38 would result in zero voltage across the resistive load 46 (see FIG. 1) which is utilized to terminate series connection of the first and second secondary windings 40 and 42.

In an alternate embodiment, the first and second primary windings 36 and 38 are configured to receive a common mode current (represented generally by reference numeral 72) from the power source 14 and to induce magnetic flux in each of the first and second secondary windings 40 and 42. In operation, a voltage sensor (not shown) is employed to measure voltage across the first and second secondary windings 40 and 42. Such measured voltage is utilized by the ground fault detection circuit 48 (see FIG. 1) to detect the ground fault at output terminals of a system such as the motor drive system 10 of FIG. 1.

In this exemplary embodiment, the magnetic flux produced by common mode current flows through each of the primary legs 64 and 66 and induces a similar polarity voltage in each of the first and second secondary windings 40 and 42. Because both secondary windings 40 and 42 have same polarity, the voltage across the resistive load 46 is utilized to detect the ground fault. During the ground fault (DC positive to ground and DC negative to ground) or surge operation between input lines and ground, the induced voltage across one primary winding couples flux into the corresponding secondary windings to detect any ground fault.

For example, if positive voltage is generated across dc plus inductor, a positive voltage would be generated across the DC negative inductor. The total DC bus voltage is equal to sum of the input rectified voltage and difference between voltage across DC positive and DC negative inductors. Thus, by detecting ground fault using this technique eliminates possible damage to the rectifier 16 by excessive currents that could result from compounded flux as in certain existing ground fault sensors. The total voltage across the rectifier is substantially reduced and does not require any secondary circuit to protect system from overvoltage failures.

Figure 3:
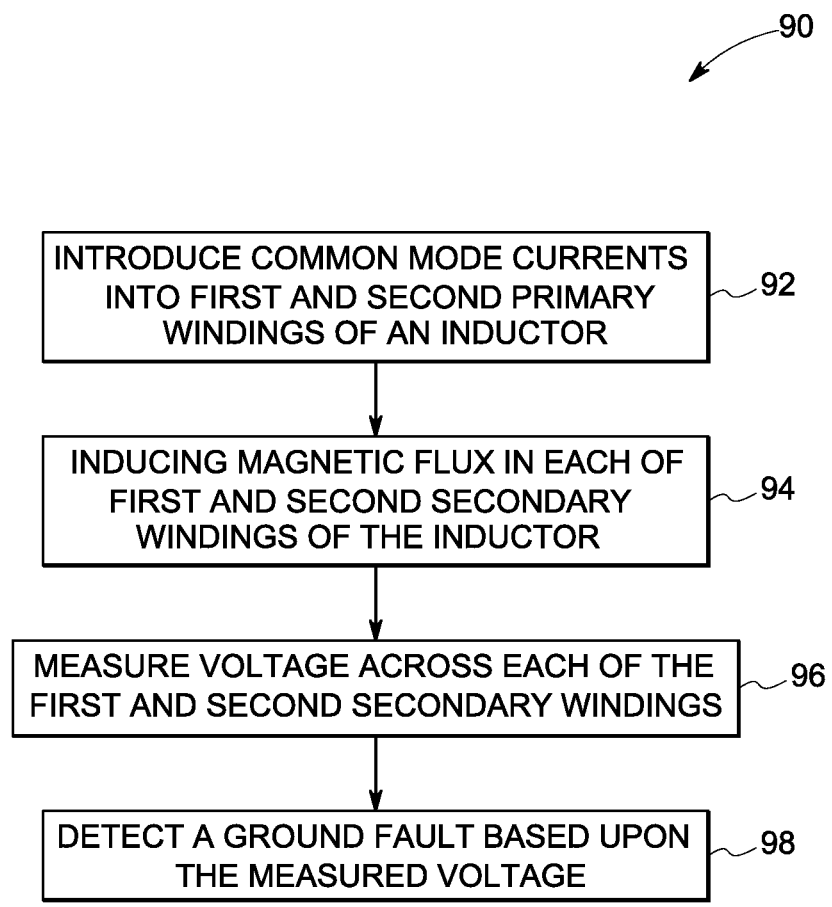
FIG. 3 illustrates an exemplary process for detecting a ground fault in accordance with aspects of the present invention.

FIG. 3 illustrates an exemplary process 90 for detecting a ground fault in accordance with aspects of the present invention. At block 92, common mode currents are introduced into first and second primary windings of an inductor. In this embodiment, the first and second primary windings are disposed on outer legs of the inductor. Further, magnetic flux is induced in each of the first and second secondary windings (block 94). In this embodiment, the first and second secondary windings are also disposed on the outer legs of the inductor.

Further, at block 96, voltage is measured across each of the first and second secondary windings. A voltage sensor may be employed to measure the voltage across each of the first and second secondary windings. At block 98, the ground fault is detected based upon the measured voltage. In this exemplary embodiment, current is passed through one of the outer legs and an inner leg of the inductor. As a result, voltage is induced across one of the first and second secondary windings and same polarity voltages are generated in the first and second primary windings thereby substantially reducing a total dc bus voltage.

In one exemplary embodiment, a turn ratio (n) of the primary and secondary windings with an inductance (Lm), a resistance ($R_1$) at a frequency ($\omega$) is estimated using the current transformer principles that are known in the art.

As will be appreciated by those of ordinary skill in the art, the foregoing example, demonstrations, and process steps may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, such as C++ or JAVA. Such code, as will be appreciated by those of ordinary skill in the art, may be stored or adapted for storage on one or more tangible, machine readable media, such as on memory chips, local or remote hard disks, optical disks (that is, CD's or DVD's), or other media, which may be accessed by a processor-based system to execute the stored code. Note that the tangible media may comprise paper or another suitable medium upon which the instructions are printed. For instance, the instructions can be electronically captured via optical scanning of the paper or other medium, then compiled, interpreted or otherwise processed in a suitable manner if necessary, and then stored in a computer memory.

The various aspects of the structures described hereinabove may be used detecting ground fault in AC motor drive systems. The technique described above facilitates detection of ground fault using primary and secondary windings disposed on outer legs of the inductor. The configuration described above facilitates reduction of total voltage stress of an AC drive system thereby preventing any over-voltage failure of the rectifier and common mode capacitors of the drive system. Further, the ground fault may be detected using substantially less number of secondary windings. The integrated dc link inductor reduces the overall number of components needed to provide ground fault detection, differential and common mode inductance thereby improving the reliability of the products.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A ground fault detection system, comprising:
a magnetic core having first and second primary legs and a secondary leg disposed between the first and second primary legs;
first and second primary windings disposed around the first and second primary legs respectively and configured to introduce current in the first and second primary legs;
first and second secondary windings disposed around the first and second primary legs respectively and coupled in series with one another; and
a ground fault detection circuit coupled to the first and second secondary windings and configured to detect ground fault based upon currents induced in the first and second secondary windings, wherein the induced currents result from magnetic flux generated in response to the introduced current through the first and second primary windings.

2. The ground fault detection system of claim 1, further comprising a resistive load configured to be disposed electrically in series between the first and second secondary windings.

3. The ground fault detection system of claim 1, wherein the first and second primary windings are configured to receive a differential mode current from a power source and to induce magnetic flux intensities having opposite directions in the first and second secondary windings respectively.

4. The ground fault detection system of claim 1, wherein the first and second primary windings are configured to receive a common mode current from a power source and to induce magnetic flux in each of the first and second secondary windings.

5. The ground fault detection system of claim 1, wherein the magnetic core comprises a voltage sensor configured to measure voltage across the first and second secondary windings.

6. The ground fault detection system of claim 5, wherein the ground fault detection circuit is configured to detect the ground fault at output terminals of a drive based upon the measured voltage.

7. The ground fault detection system of claim 6, wherein the ground fault detection circuit comprises:
a memory configured to store the measured voltages; and
a processor configured to process the measured voltages and to detect the ground fault based upon the measured voltages.

8. The ground fault detection system of claim 1, wherein the first and second primary windings comprise direct current link windings.

9. A method of detecting a ground fault, comprising:
introducing common mode currents into first and second primary windings disposed on outer legs of an inductor, and generating magnetic flux through a magnetic core;
inducing a current in each of the first and second secondary windings disposed on the outer legs of the inductor based on the generated magnetic flux;

measuring a voltage across each of the first and second secondary windings; and detecting the ground fault based upon the measured voltage.

10. The method of claim 9, wherein inducing magnetic flux comprises:

passing current through one of the outer legs and an inner leg of the inductor; and inducing a voltage across each of the first and second secondary windings disposed on the outer legs of the inductor.

11. The method of claim 10, further comprising substantially reducing a total direct current bus voltage by generating same polarity voltages in the first and second primary windings.

12. The method of claim 9, further comprising:

introducing differential mode currents into the first and second primary windings; and inducing substantially equal magnetic flux intensities having opposite directions in the first and second secondary windings respectively.

13. The method of claim 12, further comprising:

passing the induced magnetic flux intensities through the inner leg of the inductor to generate zero voltage across a resistive load; and terminating series connection of the first and second secondary windings via the resistive load.

14. A ground fault detection system, comprising:

a magnetic core having first and second primary legs and a secondary leg disposed between the first and second primary legs;

first and second primary windings disposed around each of the first and second primary legs respectively;

first and second secondary windings disposed around the first and second primary legs respectively, wherein a common mode current through the first and second primary windings is configured to induce a current in each of the first and second secondary windings; and a voltage sensor configured to measure a voltage across each of the first and second secondary windings and to detect a ground fault based upon the measured voltage.

15. The ground fault detection system of claim 14, wherein the first and second primary windings comprise direct current link windings configured to couple a rectifier and an inverter of a motor drive system.

16. The ground fault detection system of claim 14, wherein a differential mode current through the first and second primary windings is configured to induce substantially equal magnetic flux intensities having opposite directions in the first and second secondary windings respectively.

17. The ground fault detection system of claim 14, wherein a common mode current through the first and second primary windings is configured to induce substantially equal magnetic flux intensities having same directions in the first and second secondary windings respectively.

18. The ground fault detection system of claim 14, further comprising a power source configured to introduce common mode and differential mode currents through the first and second primary windings.

19. The ground fault detection system of claim 14, further comprising:

a resistive load; and a ground fault detection circuit configured to detect the ground fault based upon voltage across the resistive load.

20. The ground fault detection system of claim 19, wherein the ground fault detection circuit comprises:

a memory configured to store the measured voltages; and a processor configured to process the measured voltages and to detect the ground fault based upon the measured voltages.

* * * * *